Figure 1:
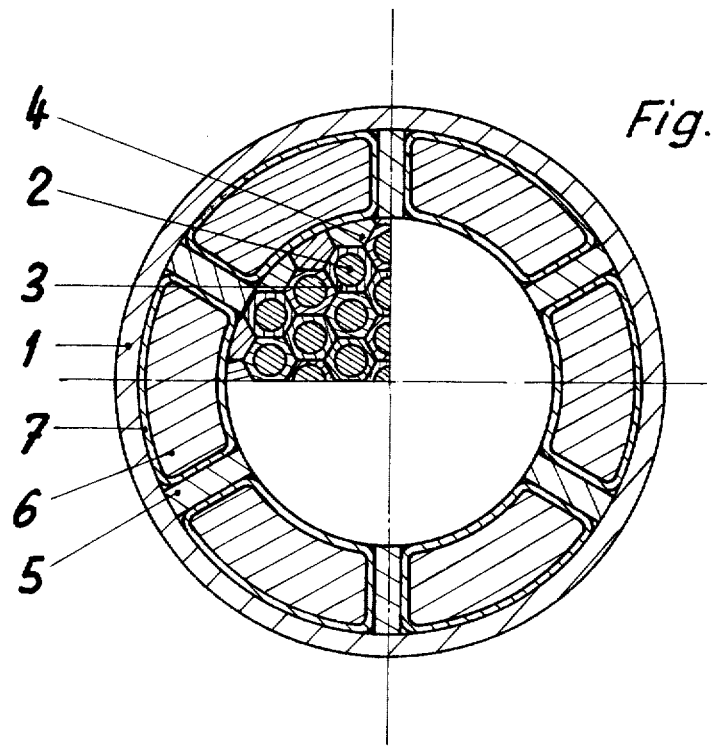

United States Patent [19]

Meyer

[11] 4,084,989

[45] Apr. 18, 1978

[54] METHOD FOR PRODUCING A STABILIZED ELECTRICAL SUPERCONDUCTOR

[75] Inventor: Gundolf Meyer, Birmenstorf, Switzerland

[73] Assignee: BBC Brown Boveri & Company Limited, Baden, Switzerland

[21] Appl. No.: 658,024

[22] Filed: Feb. 13, 1976

[30] Foreign Application Priority Data

Mar. 12, 1975 Switzerland .................. 3103/75

[51] Int. Cl.² .......................................... H01L 39/14
[52] U.S. Cl. .............................. 148/11.5 R; 29/599; 148/11.5 Q
[58] Field of Search ............... 148/11.5 R, 11.5 F, 148/11.5 Q; 29/599

[56] References Cited

U.S. PATENT DOCUMENTS

| | | | |
|---|---|---|---|
| 3,876,473 | 4/1975 | McDougall | 29/599 |
| 3,910,802 | 10/1975 | Wong | 29/599 |
| 3,925,882 | 12/1975 | Sambrook | 29/599 |
| 3,958,327 | 5/1976 | Marancik et al. | 148/11.5 R |

*Primary Examiner*—W. Stallard
*Attorney, Agent, or Firm*—Burns, Doane, Swecker & Mathis

[57] ABSTRACT

A method of producing a stabilized electrical superconductor wherein a longitudinally extending slug is provided, the slug including a matrix of copper within which are embedded, in a central region thereof, a multiplicity of wires or rods made from a superconductor-forming material such as niobium or vanadium. Surrounding the superconductor-forming material, within the outer region of the copper matrix, is a circular array of a material such as copper wires or rods having a high electrical conductivity characteristic, forming an electrically parallel connection with the superconductors which provides a bridge of good electrical conductivity in the event the superconductivity of the superconductor is lost for any reason. The slug is then worked and drawn to convert the various wire or rod components within it into filamentary form, after which a tin layer is applied to its surface. By a heating and annealing process, the tin in the surface layer diffuses radially inward through the copper matrix and into the niobium or vanadium superconductor-forming wires or rods thus to convert the latter into superconductors. The circular array of the wires or rods having the high electrical conductivity characteristic that form a bridge paralleling the superconductors are each enclosed within a sheath of a diffusion-inhibiting material such as tantalum to prevent diffusion thereinto of the tin which would otherwise undesirably reduce their electrical conductivity.

4 Claims, 2 Drawing Figures

U.S. Patent    April 18, 1978    4,084,989

METHOD FOR PRODUCING A STABILIZED ELECTRICAL SUPERCONDUCTOR

This invention relates to a method for producing a stabilized superconductor containing a plurality of filaments of super-conductive material, in which a composite parent slug is mechanically deformed to achieve intimate metallic connection between the individual slug constituents with the aid of heat treatment followed by the formation of superconductive filaments by the diffusion of at least one diffusible material component in the matrix into a second material component disposed in filament form in the interior of the conductor.

The prior art already discloses numerous filamentous superconductors based on intermetallic compounds such as $Nb_3Sn$, $V_3Ga$, $V_3Si$ and others, their common characteristics being very high critical fields ($>15T$), high critical temperatures ($>15K$) and high critical current densities in the superconductor material ($>10^6 A/mm^2$ at 5T and 4.2K). However, the superconductor materials employed to this end are all very brittle and cannot be drawn by known methods into the required thin filaments. In producing the superconductors it is therefore necessary to first deform the ductile material components, where appropriate to add specific material components only when the end product is formed and to produce the intermetallic compound by diffusion with the aid of an annealing process.

Several methods have already been disclosed for performing such processes. In one known method, Nb rods are drawn to thin diameters and the end product is passed through a bath of molten tin at a temperature of approximately 1000° C so that a $Nb_3Sn$ film is formed in the surface region of the Nb filament. The disadvantage of this method is that the intermetallic superconductor compound is formed at a high rate so that it receives a coarse-grained structure, resulting in low critical current values.

According to another known method, V-rods are inserted into a matrix comprising gallium bronze, the entire assembly being deformed together to the final diameter, followed by the formation of a $V_3Ga$ film in the surface region of the vanadium filaments by subsequent internal diffusion at a temperature of approximately 650° C obtained by diffusion annealing. The advantage compared with the first-mentioned method is the lower growth rate and therefore the fine-grained structure of the $V_3Ga$ film obtained by internal diffusion by contrast to immersion in a Ga bath by analogy to the first-mentioned method which produces a conductor with a substantially higher critical current density and prevents the formation of undesirable side phases.

According to a third known method, Nb rods are inserted into a copper matrix, the entire assembly being then deformed and after obtaining the final diameter the wire is coated with tin and the tin is allowed to diffuse externally at a temperature of 700° C through the copper to the filaments of niobium so that a $Nb_3Sn$ film is formed at least in the surface region of the niobium filaments. The advantage of this method compared with the second-mentioned method is that the matrix of copper and niobium can be drawn relatively simply while a Ga or Sn bronze would call for constant soft annealing of the wire during drawing, more particularly at the high Ga or Sn concentrations required to form a superconductor material, a feature which is very awkward, time-consuming and costly.

The disadvantage of all the methods mentioned above is that the residual matrix consists not only of the superconductive film and the residual core of the superconductor filaments, but also of the CuGa, CuSn or CuSi bronze of very poor electrical conductivity. However, to ensure stable and non-hazardous operation of a superconductor coil it is necessary to connect the conductor to a copper, aluminium or silver parallel conductor which then represents a bridge of good electrical conductivity in the event that the superconductivity of the superconductor is lost for any reason. It is advantageous if high-conductivity copper, aluminium or silver is integrated into the matrix of the superconductor. According to examples already known, the filaments or filament groups consisting of super-conductive material and also containing the bronze matrix are surrounded by diffusion barriers which are impermeable for the diffusing components, for example Sn, Ga or Si. The interior of such conductors therefore contains the super-conductive films surrounded by the bronze matrix which in turn is surrounded by a diffusion barrier and the last-mentioned barrier is surrounded on the exterior by copper or aluminium of good electrical conductivity. In some cases, pure material of the diffusing components is also provided within the diffusion barrier so as to improve the deformability of the conductor. The possibility of external diffusion of the material component which is to be diffused in order to form the super-conductive material is eliminated if the outer side of the conductor contains the substance of good electrical conductivity.

It is the object of the invention to provide a method for producing a stabilized superconductor in which the advantage of external diffusion, i.e. the simple deformation of the matrix, can be retained by a special arrangement of the conductor components although the regions of good electrical conductivity are situated in the radially outer zone of the conductor and all superconducting filaments extend within this zone of good electrical conductivity.

The method according to the invention is characterized in that the parent slug contains in the middle region of its cross-section a plurality of rods or wires consisting of the second material component which is to form the superconductive material, said rods or wires being surrounded by a material component adapted to permit the diffusible material component to diffuse therethrough, and in its radially outer region a plurality of wires or rods of material with good electrical conductivity, each of said wires or groups thereof being surrounded with a material which forms a barrier to the diffusible material component, material adapted to allow diffusion of the diffusible material component being disposed between the diffusion barriers of at least some of the wires or rods consisting of material of good electrical conductivity. It is advantageous to concentrate the superconductor filaments as far as possible in the center of the conductor so as to minimize the tension and compression forces which act on the brittle superconductor filaments if the conductor is bent.

The use of the method according to the invention achieves the formation of diffusion bridges from the outside of the conductor towards the center thereof, through which the diffusible material migrates from the outside to the said second material component which, together with the diffusible component, form the superconductor material, and the principal part of the matrix, comprising material of good electrical conductivity, is protected by the diffusion barriers against pollution by the diffusible material component which, at low temperatures, substantially reduces the electrical conductivity of the material of good electrical conductivity.

To achieve a perfect metallic and intimate bonding after mechanical deformation of the conductor, it is advantageous in some material combinations if the diffusion-permitting material contains part of the quantity of diffusible material component required to form the superconductor filaments.

The use of the method according to the invention also provides the following advantages:

a. It is not impossible for openings to occur, due to cracks, pores or the like, in the diffusion barriers which are disposed around the material of good electrical conductivity and are to be as thin as possible, given a final length of the conductor of many kilometers. At these places in previous embodiments tin could diffuse into the copper from the conductor part containing bronze to destroy the high electrical conductivity of the copper. As a consequence, the conductor could burn through in the event of rapid de-energization of a coil manufactured from the known superconductor or in the event of a sudden loss of super-conductivity in the conductor which it must be able to withstand. When using the method according to the invention, the distribution over the cross-section of material of good electrical conductivity, for example copper, into several regions which are separated from each other and are protected by diffusion barriers practically precludes the entire cross-section or a substantial part of the material of good electrical conductivity from becoming a poor electrical conductor.

b. The distribution of the cross-section of material of good electrical conductivity into several regions at a distance from each other obtained by the use of the method according to the invention results in a reduction of eddy current losses when the conductor is used in fields which vary with respect to time. Moreover, bridges of poor electrical conductivity disposed between regions of good electrical conductivity also reduce the known coupling losses between superconductor filaments situated at the greatest distance from each other and copper regions.

Figure 2:
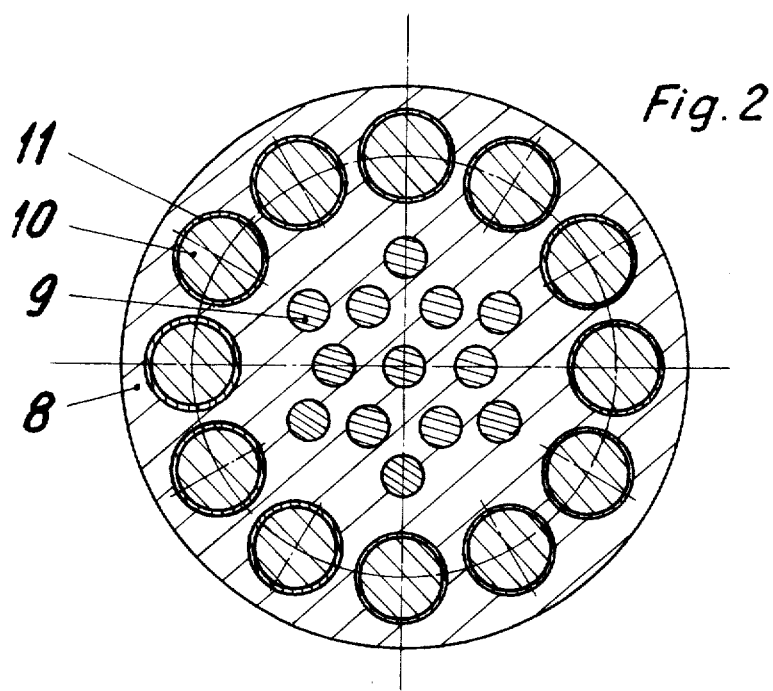

The invention will be further explained by reference to the accompanying drawing, in which:

FIG. 1 is a cross-section through a first exemplified embodiment of a parent slug for performing the method in accordance with the invention; and FIG. 2 is likewise a cross-section through a second embodiment of a slug which is to be processed in accordance with the method according to the invention for producing a multi-filament superconductor.

With reference to the embodiment shown in FIG. 1, the initial slug which is to be longitudinally worked to form the thin filaments within it includes a middle region consisting of a multiplicity of contiguous components developing a cylindrical outer surface, these components consisting of cylindrical niobium rods 2 encased in contiguous hexagonal copper tubes 3 and profiled copper rods 4 which lie contiguous to the copper tubes 3. Surrounding the copper rods 4 and lying contiguous therewith are other copper rods 6 forming circumferentially spaced segments of an annulus 2, each of these segments being encased within a sleeve 7 of tantalum which establishes a layer that blocks infusion of tin into the copper rods 6 which would otherwise undesirably lower the electrical conductivity of the copper. Copper bars 5 having a radial dimension equal to that of the tantalum covered copper segments 6 are inserted and fill the spaces between copper segments 6, and the complete cylindrical assembly formed by the alternating segments 5 and 6 is then encased within a contiguous cylindrical copper sheath 1. The sheath 1 is closed at its ends and the completed slug is then hot and cold-worked until a thin wire is obtained having a diameter of, for example, 0.5 mm containing niobium filaments. This thin wire is then tinned and the tin is allowed to diffuse radially inward at a temperature of approximately 400° C into the contiguous copper components 5, 4 and 3. The superconductive compound $Nb_3Sn$ is subsequently produced at temperatures of approximately 700° C by diffusion of the tin into the niobium filaments.

In the second embodiment, as illustrated in FIG. 2, a multiplicity of bores of different diameter are worked into a cylindrical solid copper block 8 which forms the slug to be subsequently reduced in diameter. A cluster of smaller diameter bores within the central portion of the block 8 are filled with vanadium (V) rods 9, and a circularly extending array of circumferentially spaced larger bores surrounding the inner cluster are filled with copper rods 10 each of which is encased within a protective sheath 11 of tantalum (Ta) to prevent undesirable infusion of tin that would otherwise reduce the electrical conductivity of the copper rods 10. Subsequent processing of the slug so formed then takes place in the same manner as for the embodiment of FIG. 1.

Superconductors based on $Nb_3Sn$, $V_3Ga$, $V_3Si$ and other similar compounds can be produced in a similar way from initial slugs as shown in FIGS. 1 and 2.

The niobium rods as well as the copper rods can be firmly clad with copper or tantalum in a preceding process step.

The shaped components 1, 2, 3, 4 5 and 8 can be produced from a bronze alloy, which facilitates processing but has a reduced content of the diffusible component. External diffusion on the finished conductor then merely raises the diffusible component to the required final value.

The tinning and annealing operations can be performed in steps, namely by the superconductor filaments being formed through one or more diffusion anneals which follow one or more tinning and inward diffusion anneals. This permits a substantial reduction of the alloy matrix cross-section in relation to the Nb or V component because in this way it is possible to substantially prevent impoverishment of the diffusible component in the bronze matrix.

Copper with a high electrical conductivity can be replaced by silver or by aluminium which has even better electrical conductivity at low temperatures and in high magnetic field strengths.

The action of the diffusion-blocking layers is based on the slowly proceeding reaction of these materials with the diffusible components. Their wall thicknesses must therefore be large compared with the reaction layer thicknesses which form during the annealing period. The diffusion-blocking material can be the same as that of the filament-forming rods 2 or 9 when the conductor is to be used in fields whose strength alters only slightly with respect to time. A material which has only poor superconductive properties under the operating conductions of the magnet coil which is manufactured from the conductor will however be selected when the said conductor is used in magnetic fields which alter rapidly with respect to time.

The rods 2 or 9 can comprise Cu or lightly alloyed bronze rods, produced in a preceding manufacturing step and containing in their interior a substantial number of Nb or V rods.

Cu rods clad with diffusion barriers can of course also be arranged in the center of the conductor cross-section if this should be deemed advantageous in the interests of deforming the conductor.

To obtain the desired purity and quality of the diffusion-blocking materials, it is essential that these can be uniformly processed during the cold working process steps without embrittlement which would call for intermediate anneals with excessive and therefore impermissible temperatures.

I claim:

1. The method for producing a stabilized superconductor containing a plurality of thin filaments of superconductive material which comprises the steps of:

mechanically working a composite parent slug to achieve intimate metallic connection between the individual abutting constituents of the slug to form a relatively thin composite conductor structure, the middle region of the cross-section of said conductor structure including a plurality of mutually spaced filaments consisting of a first superconductor-forming material surrounded by a second material which permits radially inward diffusion of a third material therethrough into said first material to convert the latter into stabilized superconductor filaments, the radially outer region of said conductor structure including a plurality of mutually spaced conductors of a fourth material having a good electrical conductivity characteristic and each of which is covered by a layer of a fifth material forming a barrier against penetration of said diffusible third material, a sixth material which permits radially inward diffusion of said third material disposed between the diffusion barriers formed on at least some of said conductors of good electrical conductivity characteristic, and outer material which also permits radially inward diffusion of said third material and which surrounds said conductors having a good electrical conductivity characteristic;

applying a layer of said third material to said outer material; and effecting by heat treatment diffusion of said third material radially inward through said outer material and said sixth and second materials into said first filamentary material to convert the latter into superconductors.

2. The method for producing a stabilized superconductor as defined in claim 1 wherein Nb or V is used for said superconductor-forming filamentary material, and Sn, Ga or Si is used for said third material which diffuses into said superconductor-forming filamentary material.

3. The method for producing a stabilized superconductor as defined in claim 1 wherein Cu is used for said second, sixth, and outer materials.

4. The method for producing a stabilized superconductor as defined in claim 1 wherein the diffusion barrier layer covering each of said conductors having a good electrical conductivity characteristic is Ta, Nb, V, or an alloy thereof.

* * * * *